(12) United States Patent
Baniecki et al.

(10) Patent No.: US 7,618,859 B2
(45) Date of Patent: Nov. 17, 2009

(54) THIN FILM CAPACITOR AND FABRICATION METHOD THEREOF

(75) Inventors: John David Baniecki, Kawasaki (JP); Takeshi Shioga, Kawasaki (JP); Kazuaki Kurihara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/219,577

(22) Filed: Jul. 24, 2008

(65) Prior Publication Data

US 2008/0305607 A1 Dec. 11, 2008

Related U.S. Application Data

(62) Division of application No. 11/582,480, filed on Oct. 18, 2006, now Pat. No. 7,417,276.

(30) Foreign Application Priority Data

Mar. 31, 2006 (JP) ............................. 2006-100595

(51) Int. Cl.
*H01L 21/8242* (2006.01)
(52) U.S. Cl. .................. 438/240; 438/256; 438/239; 438/250; 438/E21.009
(58) Field of Classification Search .................. None
See application file for complete search history.

(56) References Cited

U.S. PATENT DOCUMENTS 6,624,462 B1 9/2003 Kohara et al.
2006/0094185 A1* 5/2006 Jeong et al. ................. 438/253

FOREIGN PATENT DOCUMENTS

JP 2929435 B2 8/1999

* cited by examiner

*Primary Examiner*—Dung A. Le
(74) *Attorney, Agent, or Firm*—Westerman, Hattori, Daniels & Adrian, LLP

(57) ABSTRACT

A thin film capacitor comprising a top electrode, a bottom electrode, and a dielectric film held between the top and bottom electrodes. The dielectric film is composed of at least cations Ba, Sr, and Ti and anion O. The concentration of Sr, Ti, and O ions are uniform along the growth direction of the dielectric film while the concentration of the Ba cation is non-uniform along the growth direction such that a reduced Ba-I region in which the average concentration of perovskite type Ba cations (Ba-I) is less than the average concentration of non-perovskite type Ba cations (Ba-II) exists at or near the boundary between at least one of the top and bottom electrodes, with ratio R=(atm % Ba-I)/[(atm % Ba-I)+(atm % Ba-II)] within a range of 0.1<R<0.2.

7 Claims, 10 Drawing Sheets

FIG.5A
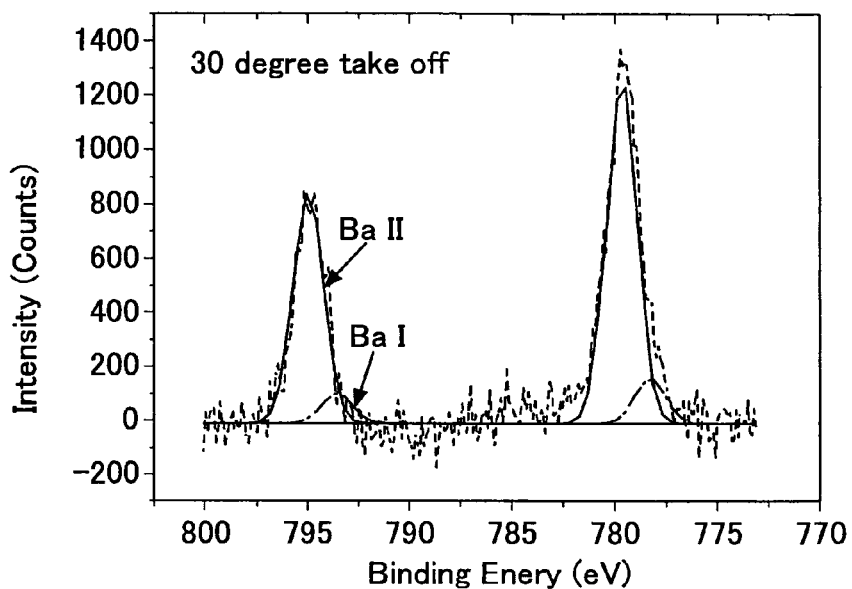
FIG.5B
| ARXPS | Area(30) |
|---|---|
| Ba3d I | 989.9 |
| Ba3d II | 6284.7 |
| R | 0.14 |
FIG.5C
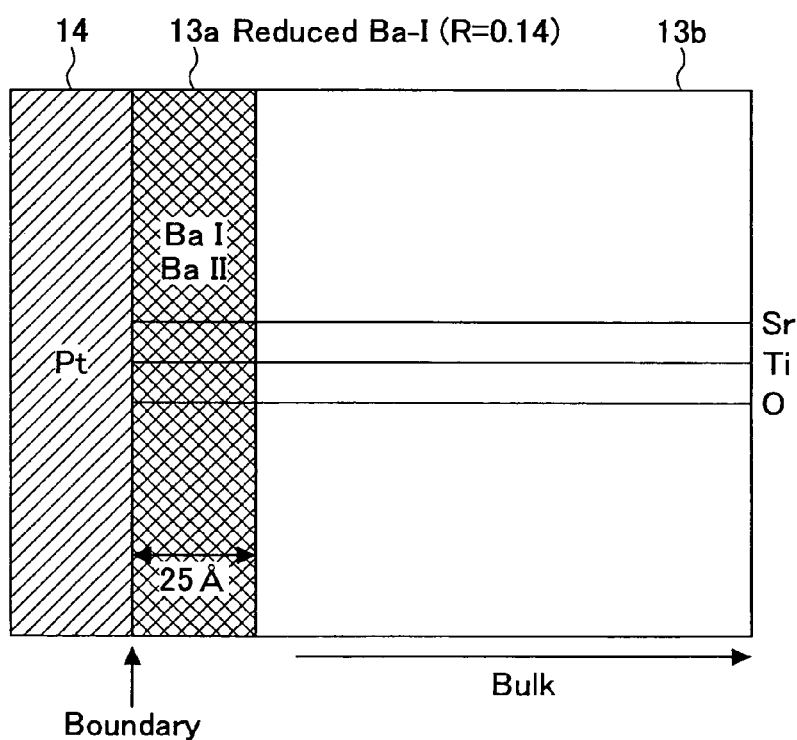

US 7,618,859 B2

THIN FILM CAPACITOR AND FABRICATION METHOD THEREOF

This application is a divisional of application Ser. No. 11/582,480, filed Oct. 18, 2006.

BACKGROUND OF THE INVENTION

1. Field of the Invention

The present invention relates in general to a thin film capacitor, and more particularly, to a thin film capacitor using a perovskite type dielectric film with a specific distribution profile along the growth direction, which capacitor is capable of reducing electric current leakage and enhancing service life of devices.

2. Description of the Related Art

Thin film $ABO_3$ perovskite type dielectric materials, such as barium strontium titanate (BST: $(Ba,Sr)TiO_3$), are currently being investigated for applications in microwave and RF devices and as charge storage devices for decoupling capacitor and DRAM applications. For these applications a high capacitance density, low leakage current, reduced dielectric loss, and long service life are required.

One of the major problems impeding the use of polycrystalline high dielectric constant oxide thin films, such as $(Ba,Sr)TiO_3$, in device applications is achieving capacitance densities sufficient for device applications while maintaining low leakage with good service life.

Japanese Patent Registration No. 2929435 (corresponding to U.S. Pat. No. 5,783,253) discloses a technique for forming a dielectric film with improved physical and electrical characteristics, achieving a higher dielectric constant and smooth surfaces. With this method, a first BST film of a Barium composition x ($Ba_xSr_{1-x}$) is formed, and then a second BST film of a different Ba composition x' (x'=0.5) ($Ba_{0.5}Sr_{0.5}$) is formed over the first BST film. The first BST film serves to improve the surface roughness, and the second BST film serves to achieve a higher dielectric constant.

SUMMARY OF THE INVENTION

The present invention was conceived in view of the above-described problems, especially of miniaturized device applications, and the embodiments provide a novel structure of a thin film capacitor with reduced leakage current density and enhanced capacitor service life.

To be more precise, the present invention utilizes a novel graded chemical composition structure where the Ba cation is non-uniform in the surface region of a dielectric (BST) film such that the average concentration ratio of perovskite type Ba cations (Ba-I) to the average concentration ratio of non-perovskite type Ba cations (Ba-II) is less than unity (e.g., less than 1) within a certain depth from the top surface.

In one aspect of the invention, a thin film capacitor comprises a top electrode, a bottom electrode, and a dielectric film located between the top and the bottom electrodes and comprised of at least the cations Ba, Sr, Ti and anion O. The concentration of Sr, Ti, and O ions are uniform along the growth direction of the dielectric film. The dielectric film has a reduced Ba-I region at or near the boundary between the dielectric film and at least one of the top and bottom electrodes, in which the average concentration of perovskite type Ba cations (Ba-I) is less than the average concentration of non-perovskite type Ba cations (Ba-II), and in which the average concentration ratio R is within the range of 0.1<R<0.2, where R is (atm % Ba-I)/[(atm % Ba-I)+(atm % Ba-II)].

In another aspect of the invention, a method of fabricating a thin film capacitor is provided. The method comprises the steps of:

(a) forming over a bottom electrode a dielectric film comprised of at least Ba, Sr, Ti, and O ions at certain compositions; and (b) when forming a top electrode over the dielectric film, controlling a condition of film deposition of the top electrode so as to produce a reduced Ba-I region in a surface region of the dielectric film in which the average concentration of perovskite-type Ba cations (Ba-I) is less than the average concentration ratio of non-perovskite type Ba cations (Ba-II).

In a preferred example, the film deposition of the top electrode is controlled such that the average concentration ratio R is within range of 0.1<R<0.2, where R is (atm % Ba-I)/[(atm % Ba-I)+(atm % Ba-II)].

In another preferred example, after the fabrication of the top electrode, annealing is performed at 100-900° C. in an oxygen atmosphere to adjust the R value. This arrangement can efficiently reduce the leakage current density.

With the above-described structure and method, the leakage current density of a thin film capacitor can be reduced and the device service life is enhanced.

BRIEF DESCRIPTION OF THE DRAWINGS

Other objects, features, and advantages of the present invention will become more apparent from the following detailed description when read in conjunction with the accompanying drawings, in which:

FIG. 5A through FIG. 5C are schematic diagram illustrating chemical shift, relative ratio of Ba-I concentration to Ba-II concentration, and the physical structure near the interface of a Pt/BST sample, respectively;

DETAILED DESCRIPTION OF THE PREFERRED EMBODIMENTS

The preferred embodiments of the invention are now described in conjunction with the attached drawings.

Figure 1:
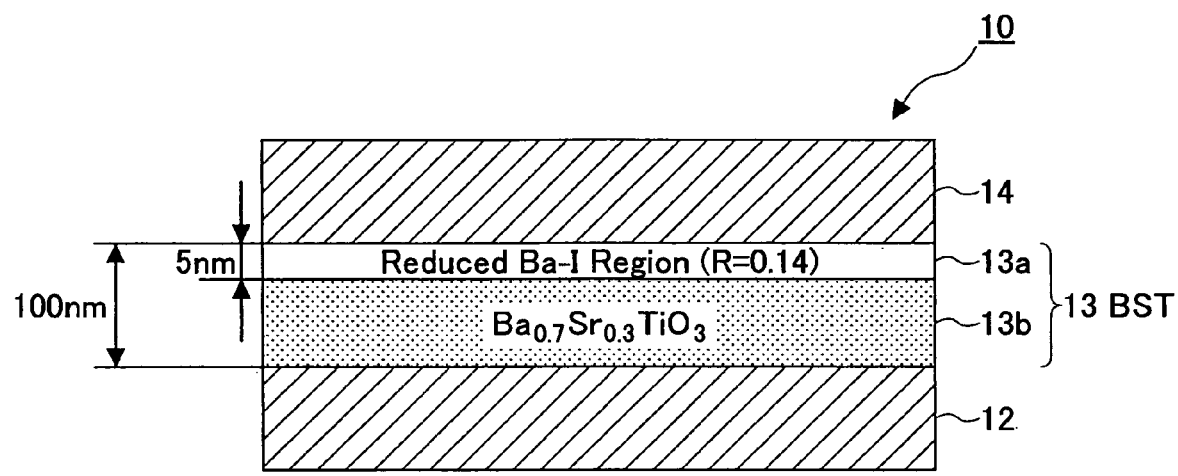
FIG. 1 is a schematic cross-sectional diagram of a thin film capacitor according to an embodiment of the invention.

FIG. 1 is a schematic cross-sectional diagram of a thin film capacitor 10 illustrated as an example of integrated thin film devices. The thin film capacitor 10 has a bottom electrode 12, a top electrode 14, and a dielectric film 13 inserted between the bottom and top electrodes 12 and 14. The dielectric film 13 is comprised of at least Ba, Sr and Ti cations and O anions.

Ba cations have a specific concentration profile in the surface area along the growth direction, while Sr, Ti and O ions have constant distribution profiles in the dielectric film 13.

To be more precise, the dielectric film 13 includes a reduced Ba-I region 13a located in the surface area, and a bulk region 13b with constant compositions. In the reduced Ba-I region 13a, the average concentration ratio [atom %] of perovskite type Barium ions (referred to as "Ba-I") is less than the average concentration ratio of non-perovskite type Barium ions (referred to as "Ba-II"). The relative concentration ratio R of Ba-I is expressed as $$R=(Ba\text{-}I \text{ atom }\%)/[(Ba\text{-}I \text{ atom }\%)+(Ba\text{-}II \text{ atom }\%)],$$

and R is within the range of $0.1<R<0.2$. In the example shown in FIG. 1, R is 0.14 (R=0.14).

The reduced Ba-I region 13a extends to 5 nm depth, and more preferably, to 2.5 nm depth, from the boundary face (interface) between the top electrode 14 and the dielectric film 13. The compositions of Sr, Ti, and O are constant even in the reduced Ba-I region 13a, as in the bulk region 13b. In the bulk region 13b, the composition is $(Ba_{0.7}Sr_{0.3})TiO_3$.

Figure 2:
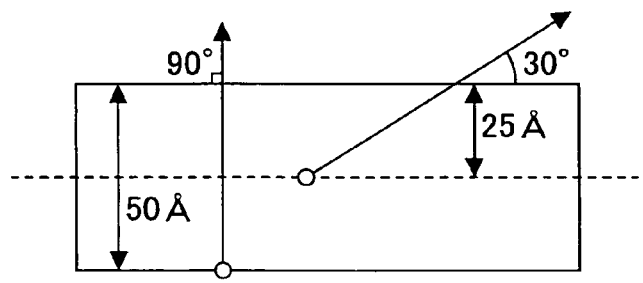
FIG. 2 is a schematic diagram for explaining angle resolved X-ray photoelectron spectroscopy (ARXPS) for measuring the concentration distribution of ions along the growth direction of the reduced Ba-I regions of a BST dielectric film according to an embodiment of the invention.

FIG. 2 is a schematic diagram for explaining angle resolved X-ray photoelectron spectroscopy (ARXPS) used to measure the ion concentration of a sample with a reduced Ba-I region in the surface area.

Upon irradiation of X-rays onto the sample in a vacuum, photoelectrons (secondary electrons) existing in the region of up to 5 nm to 6 nm depth of the sample are emitted from the sample surface. The takeoff angle (i.e., the detection angle) is varied to measure the energies of the photoelectrons and the number of photoelectrons (i.e., the intensity) ejected from the inner shells of the atoms contained in the sample. From the analysis of the ARXPS measurement, what kinds of atoms exist in what phases at which locations (depths from the sample surface) can be determined.

In the example shown in FIG. 2, photoelectrons are detected at takeoff angles of 30° and 90° to measure the ion concentrations of Ba, Sr, Ti and O at 2.5-nanometer depth and 5.0-nanometer depth, respectively, from the surface. From the measurement the concentration and chemical states of Ba, Sr, Ti cations can be determined.

Figure 3A:
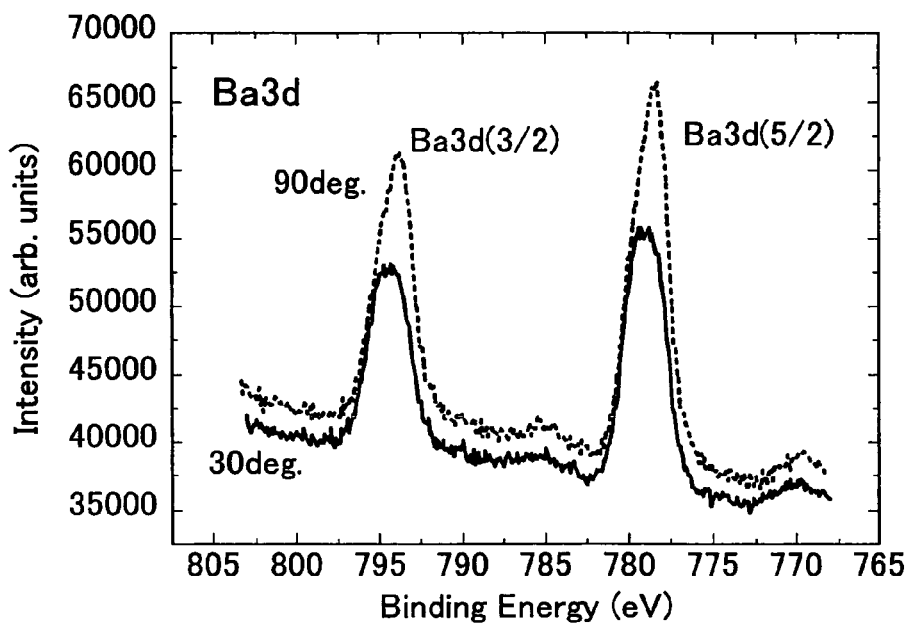
FIG. 3A through FIG. 3D are graphs showing the ARXPS measurement results.
Figure 3B:
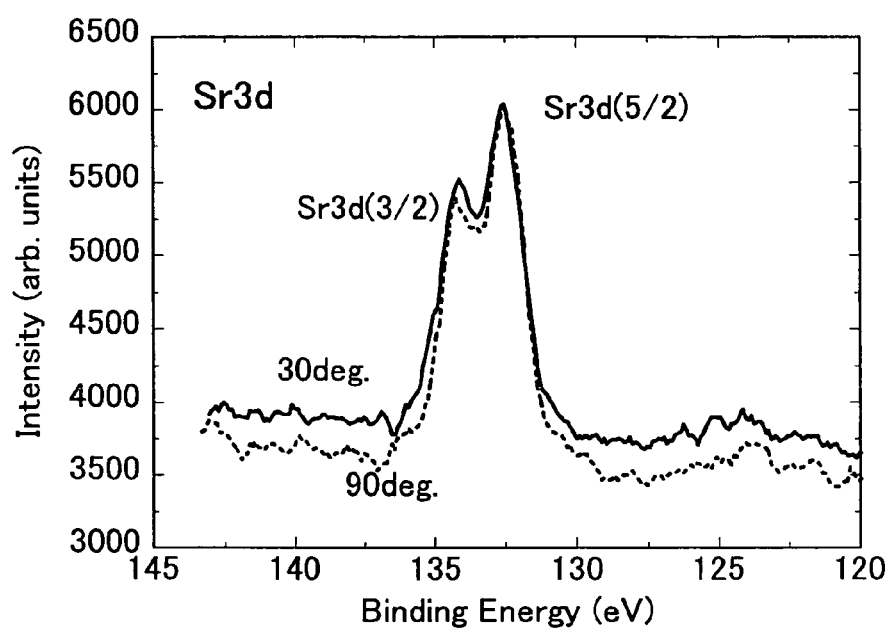
Figure 3C:
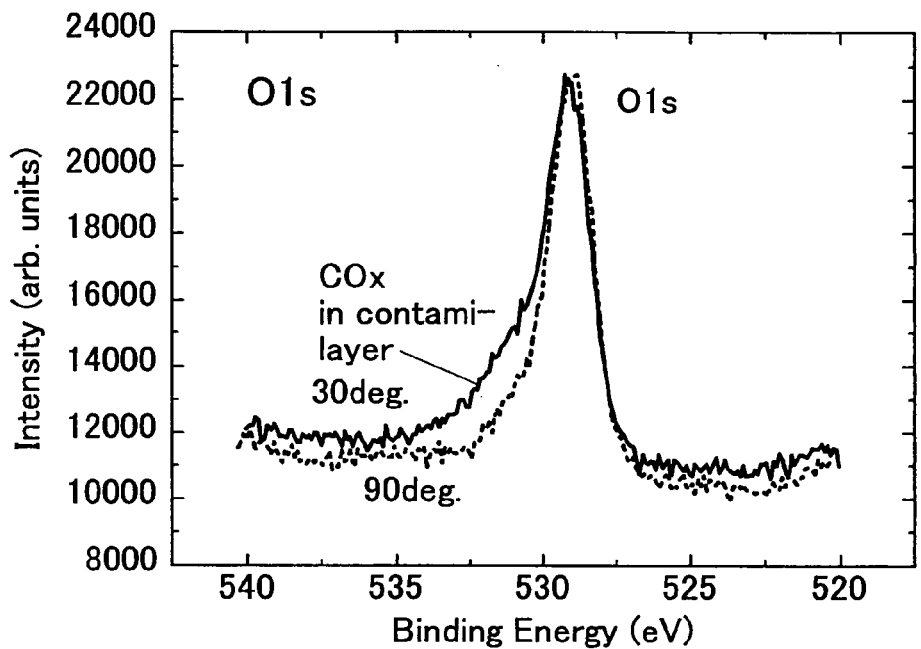
Figure 3D:
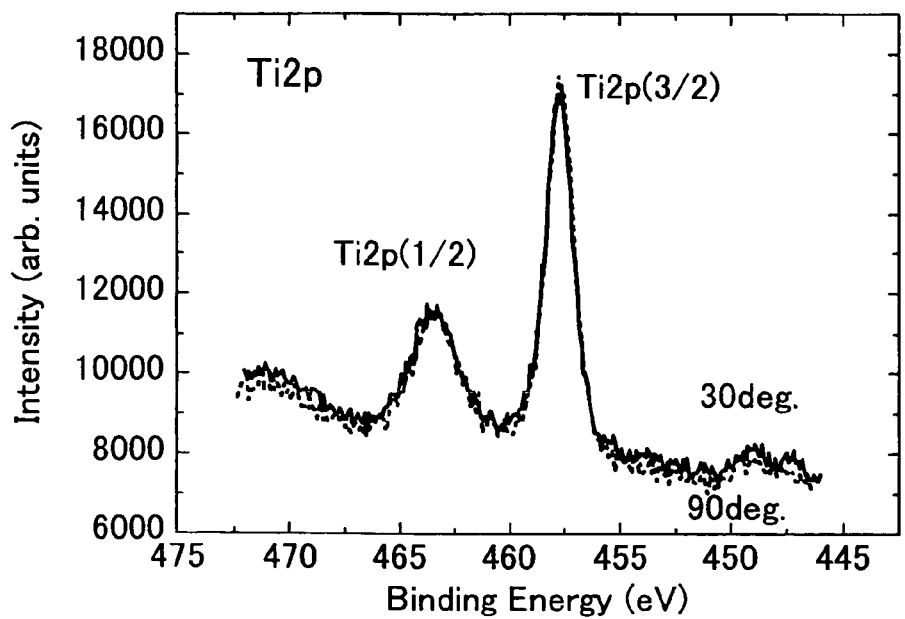

FIG. 3A through FIG. 3D are graphs of the ARXPS measurement results. In the graphs, the solid lines represent the XPS spectrums for the 30-degree takeoff angle (at a shallow location), and the dashed lines represent the XPS spectrums for the 90-degree takeoff angle (at a deep location). FIG. 3A shows the photoelectron spectrums from the 3d electron trajectory of Ba, FIG. 3B shows those from the 3d electron trajectory of Sr, FIG. 3C shows those from the 1s electron trajectory of O, and FIG. 3d shows those from the 2p electron trajectory of Ti. A chemical shift is observed in the Ba 3d lines, while the other elements Sr, Ti and O show no chemical shift with angle dependence and are uniform along the growth direction.

In the Ba 3d spectrums in FIG. 3A, the right-side-hand peak is of spin 5/2, and the left-hand-side peak is of spin 3/2. Each peak is a combination of Ba ions of different phases, that is, perovskite-phase Ba-I and non-perovskite-phase Ba-II, as illustrated in FIG. 4A and FIG. 4B.

Figure 4A:
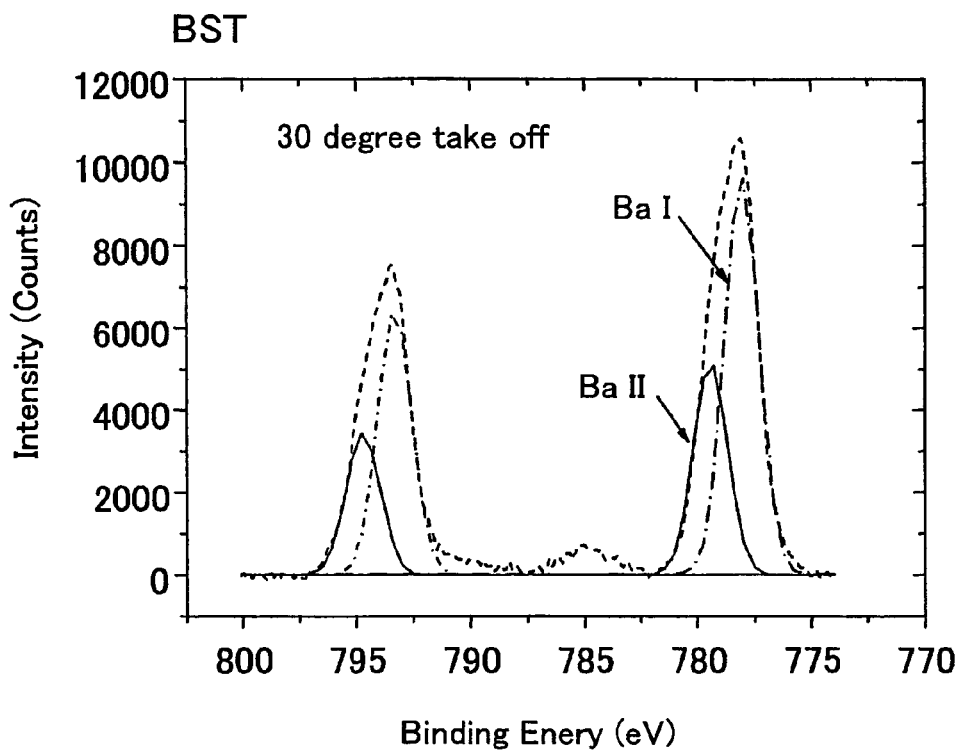
FIG. 4A and FIG. 4B are angle resolved XPS data showing that the R value can be controlled by top Pt film deposition over the BST dielectric film.
Figure 4B:
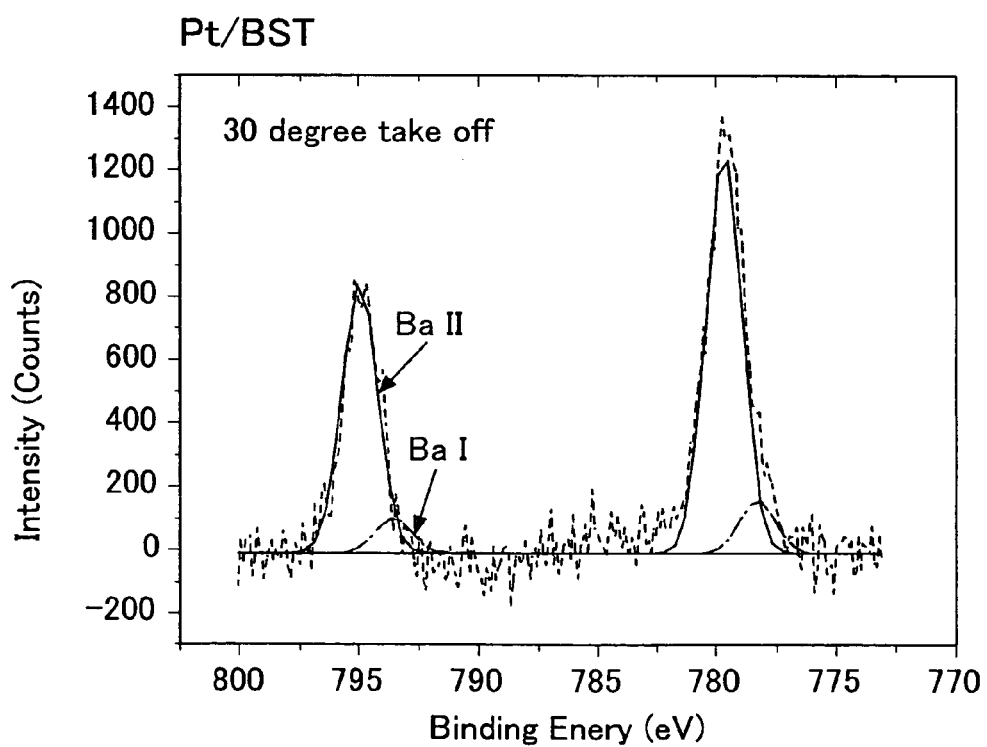

FIG. 4A and FIG. 4B show that the concentration ratio of Ba ions in the perovskite phase (Ba-I) can be controlled with respect to Ba ions in the non-perovskite phase (Ba-II) through film deposition of the top Pt electrode 14 over the BST film 13.

From the ARXPS data of a BST sample (without a Pt film over it) for the 30-degree takeoff angle shown in FIG. 4A, the binding energy of Ba-I, which spectrum is represented by the dotted broken line, is lower than the binding energy of Ba-II, which spectrum is represented by the solid line. For the spin 5/2 peak, the binding energy of Ba-I is 778 eV, and that of Ba-II is 779.4 eV. The Ba-I concentration is double the Ba-II concentration.

In contrast, from the ARXPS data of a Pt/BST sample shown in FIG. 4B, in which a Pt film is formed over the BST film formed under the control of deposition conditions, the concentration ratio of Ba-I relative to Ba-II has been altered such that the Ba-I concentration becomes much less than the Ba-II concentration. To control the deposition conditions during the formation of the Pt film over the BST film, the power and/or the pressure may be adjusted so as to introduce defects in the surface area of the BST film (which defects increase non-perovskite-phase Ba-II relative to perovskite-phase Ba-I). Thus, it is understood from FIG. 4A and FIG. 4B that the Ba-I concentration can be reduced with respect to the Ba-II concentration in the surface area of the BST film through the formation of the Pt film over the BST film under certain conditions.

The relative ratio of Ba-I to Ba-II can also be controlled to a desired value by performing acid cleaning on the BST surface prior to forming the Pt film to remove Ba-II while leaving the Ba-I component, and then forming a Pt film over the cleaned surface of the BST film. This arrangement can reduce the Ba-I concentration in the surface area of the BST film, relative to the Ba-II concentration therein.

FIG. 5A through FIG. 5C are ARXPS data and the physical structure of a Pt/BST sample. The ARXPS spectra of FIG. 5A show the Ba-I concentration reduced relative to the Ba-II concentration in the surface area (measured at 30-degree take off) of the BST film, which profiles are achieved by forming a Pt film over the BST film under the control of deposition conditions. The table of FIG. 5B shows the Ba-I counts and the Ba-II counts of 3d electron trajectory and the relative concentration ratio R at the ejection angle of 30 degrees. In the reduced Ba-I region 13a of the BST film 13 located near the interface with the Pt film 14 shown in FIG. 5C, the concentration of perovskite-phase Ba ions (Ba-I) is reduced such that the relative ratio R become 0.14. In contrast, the remaining atoms Sr, Ti, and O maintain substantially constant compositions throughout the BST film 13. This film structure is effective to reduce electric current leakage at or near the boundary between the dielectric film and the electrode.

Figure 6A:
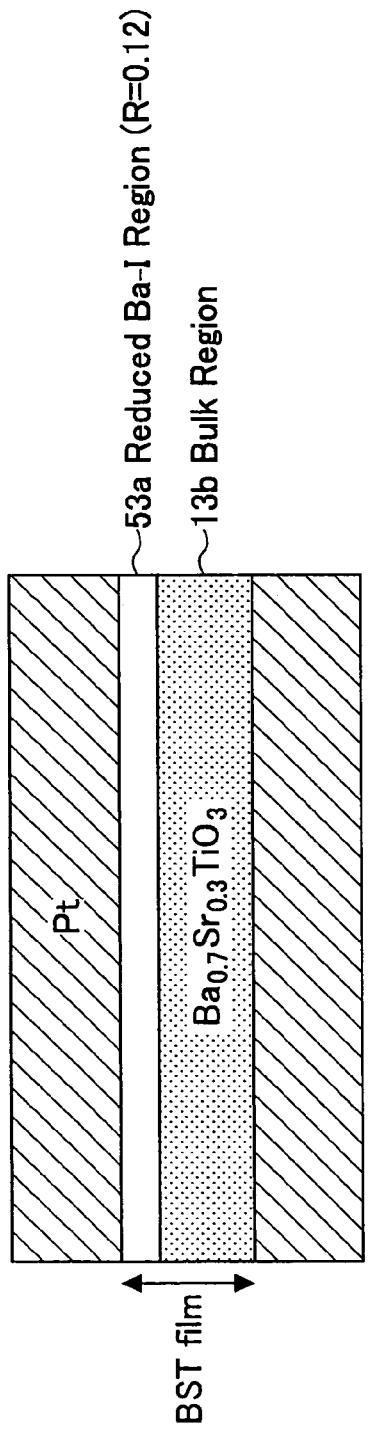
FIG. 6A and FIG. 6B are schematic cross-sectional diagrams illustrating R-value control by annealing.
Figure 6B:
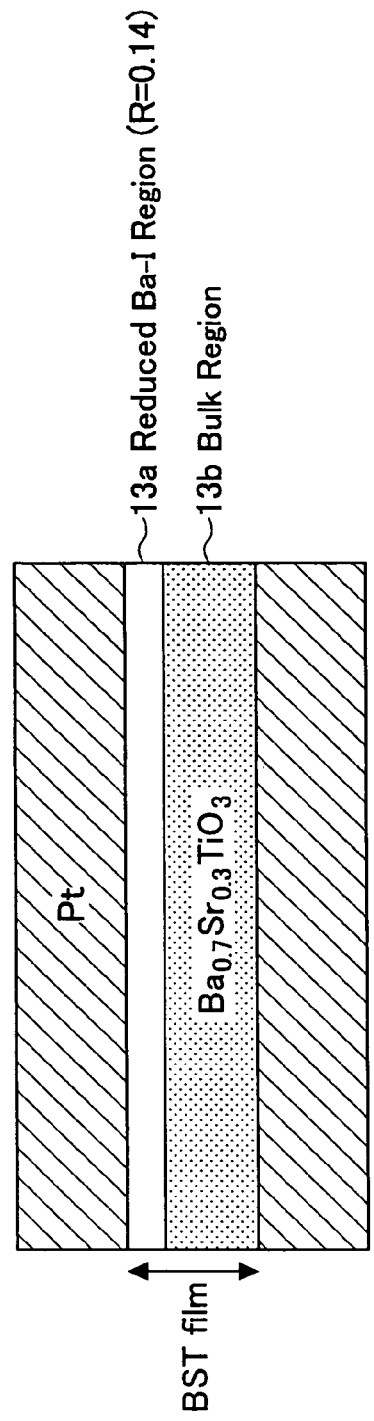

The relative intensities of perovskite-phase Ba-I and non-perovskite-phase Ba-II can be further controlled by annealing treatment, as illustrated in FIG. 6A and FIG. 6B. For example, the reduced Ba-I region 53a with R value of 0.12 is produced in the surface area of the BST dielectric film 13 through the deposition of a Pt film under the controlled conditions, as illustrated in FIG. 6A. Then, annealing treatment is performed in the temperature range of 100° C. to 900° C. in an oxygen atmosphere for a certain period of time. Through the annealing treatment, the enhanced reduced Ba-I region 13a with the R value improved from 0.12 to 0.14 is obtained.

Figure 7A:
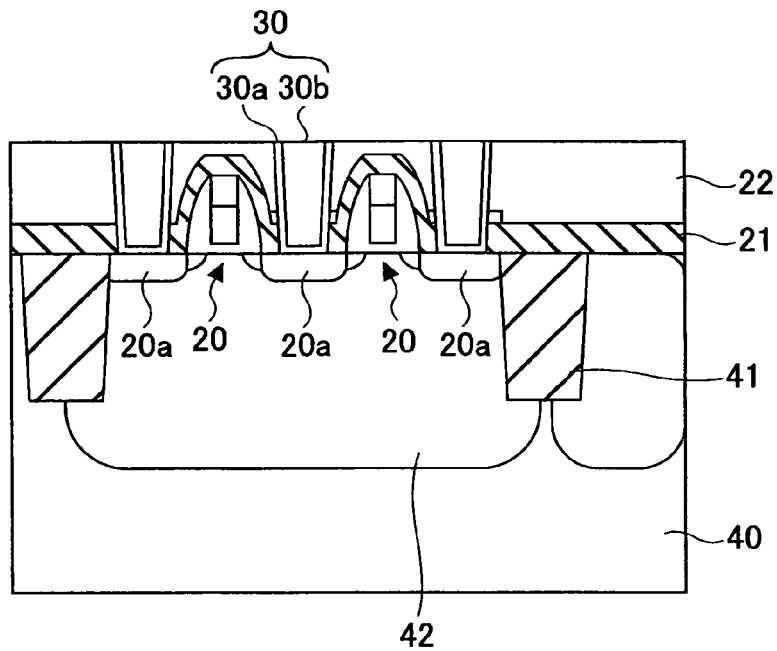
FIG. 7A through FIG. 7E are schematic cross-sectional diagrams illustrating a fabrication process of a semiconductor device with a thin film capacitor.

FIG. 7A through FIG. 7E illustrate a semiconductor device fabrication process, which device has a thin film capacitor. First, as illustrated in FIG. 7A, MOS transistors 20 are formed in a well region 42 in a semiconductor substrate 40 using a known technique. The well region 42 is isolated from the adjacent well regions by isolations (such as STI) 41. A cover film (such as SiON film) 21 is formed over the entire surface to protect the MOS transistors 20. Then, a first interlevel dielectric layer 22 is deposited. Contact plugs 30 are formed in the first interlevel dielectric layer 22 so as to reach the impurity diffused regions 20a of the MOS transistors 20. The contact plug 30 may be formed by sputtering a TiN/Ti glue layer 30a in a contact hole (not shown) formed in the interlevel dielectric layer 22, then filling the contact hole with a tungsten (W) layer 30b by CVD, and then flattering the top surface by CMP.

Figure 7B:
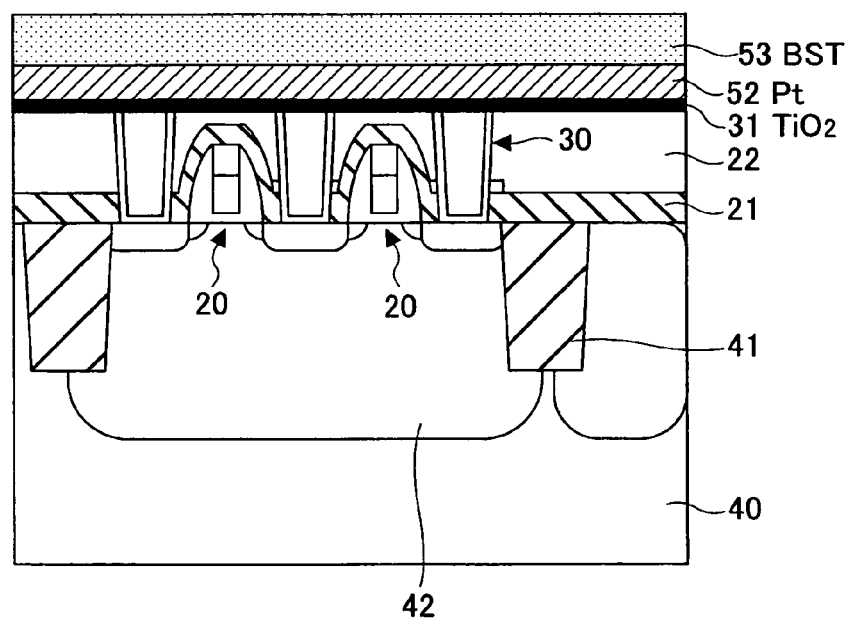

Then, as illustrated in FIG. 7B, a TiO2 adhesion layer 31 is deposited over the entire surface by a suitable deposition method, such as RF magnetron sputtering. Then, a Pt film 52 with a thickness of 100 nm and a BST film 53 with a thickness of 100 nm are deposited successively by RF magnetron sputtering. The composition of the BST film 53 is $(Ba_{0.7}Sr_{0.3})TiO_3$. In the As-Deposition, perovskite-phase Ba-I and non-perovskite-phase B-II coexist in the surface area of the BST film 53. Then, acid cleaning is performed to clean the surface of the BST film 53. With the acid cleaning, Ba-II is removed, while Ba-I stays in the BST film 53.

Figure 7C:
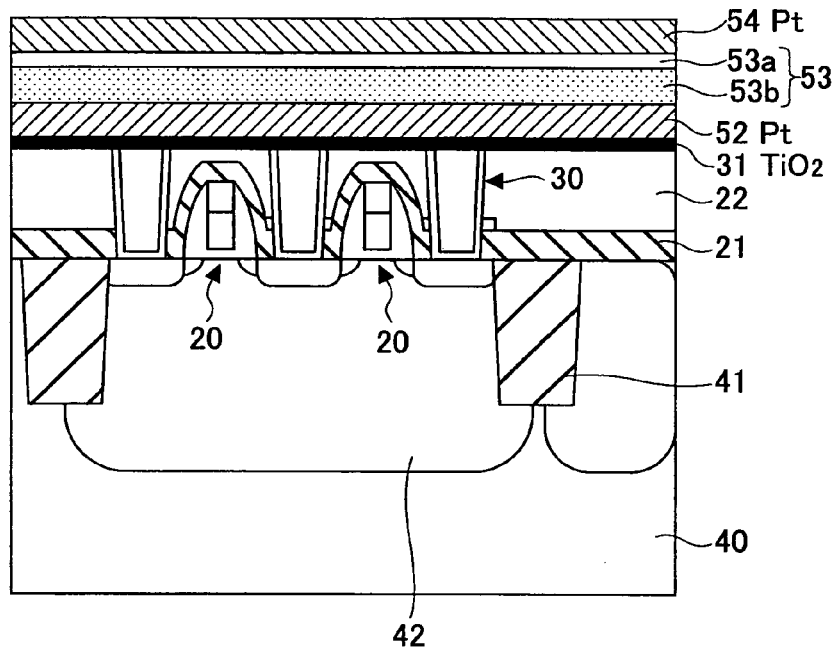

Then, as illustrated in FIG. 7C, a 100-nm-thick Pt film 54 is formed over the cleaned surface of the BST film 53 by sputtering or electron-beam deposition. By controlling the deposition power and/or the pressure, a reduced Ba-I region 53a, in which concentration ratio of perovskite-phase Ba-I is less that that of non-perovskite-phase Ba-II, is produced in the surface area of the BST film 53. The relative ratio R expressed as (atom % Ba-I)/[(atom % Ba-I)+(atom % Ba-II)] in the reduced Ba-I region 53a is 0.12 (R=0.12) in this example achieved by setting the power and the pressure to 100 W and 0.1 Pa, respectively, during the formation of the Pt film 54. The deposition conditions for generating the reduced Ba-I region 53a in the BST film 53 may be controlled throughout or a part of the Pt film deposition process.

Figure 7D:
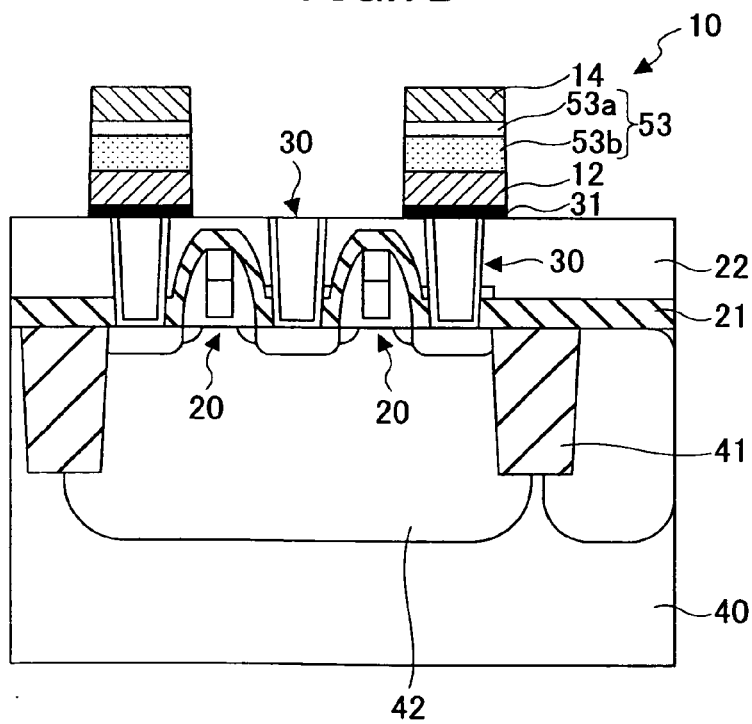

Then, as illustrated in FIG. 7D, the Pt film 54, the BST film 53, the Pt film 52 and the TiO2 film 31 are patterned by a standard photolithography process to form a thin film capacitor 10. The thin film capacitor 10 comprises a top electrode 14, a bottom electrode 12, and a BST dielectric film 53 held between the top and bottom electrodes. The BST dielectric film 53 includes the reduced Ba-I region 53a formed near the boundary with the top electrode 54 and a bulk region 53b of constant compositions.

Figure 7E:
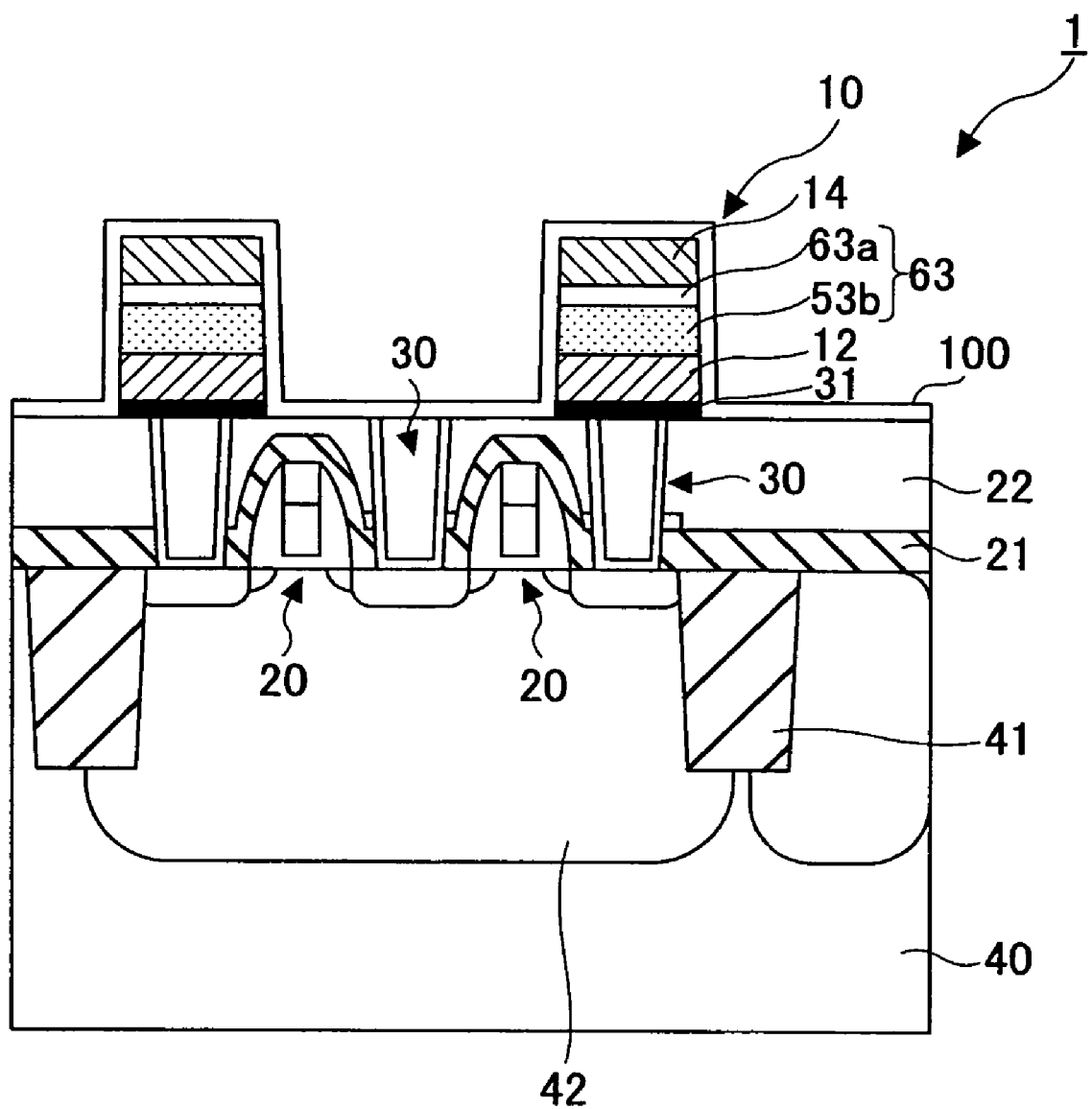

Then, as illustrated in FIG. 7E, an aluminum (Al) protection film 100 is formed over the entire surface, and annealing treatment is performed on the thin film capacitor 10 at 400° C. in O2 atmosphere for 15 minutes to improve the R value to 0.14 (R=0.14). As a result, the BST film 63 having the enhanced reduced Ba-I region 63a is obtained.

Although not illustrated in the drawings, another interlevel dielectric layer is formed over the Al protection film 100. A contact plug (not shown) electrically connected to the lower-level contact plug 30 and a contact plug (not shown) connected to the top electrode 14 of the thin film capacitor 10 are formed in the interlevel dielectric layer, and upper-level metal wirings are formed over the flat surface of the interlevel dielectric layer to complete a semiconductor device 1 with integrated thin film capacitors 10.

Figure 8:
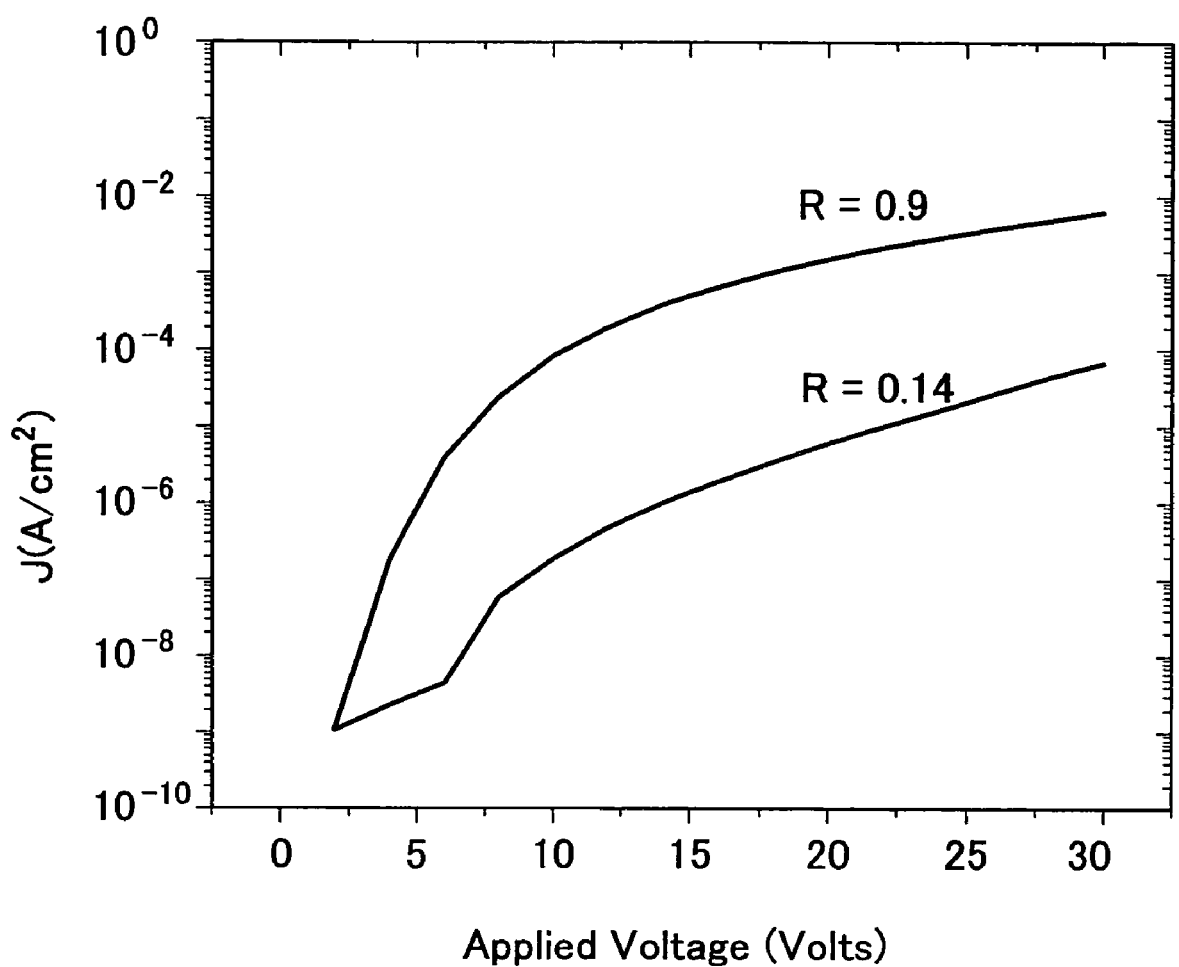
FIG. 8 is a graph showing the leak current density reducing effect achieved by controlling of the Ba-I relative concentration.

FIG. 8 is a graph of the leakage current density as a function of applied voltage, showing superior performance for a structure with R within the specified range. As compared with the original BST film with the R value of 0.9 (R=0.9), the enhanced reduced Ba-I region with the R value of 1.4 (R=0.14) in which the concentration ratio of perovskite-phase Ba-I is substantially reduced can reduce leakage current density by two orders of magnitude. Along with the reduction of the leakage current density, the service life of the thin film capacitor 10 is improved.

Although the present invention has been described using specific examples, the invention is not limited to these example, and many modifications and substitutions can be made by those with an ordinary skill in the art. For example, in the embodiment the deposition process of the top Pt electrode film is controlled to reduce the concentration ratio of the perovskite-phase Ba ions (Ba-I) in the boundary region between the top electrode and the BST dielectric film; however, the reduced Ba-I region may be provided at the boundary between the BST dielectric film and the bottom electrode.

The semiconductor substrate may be composed of a material selected from the group consisting of silicon (Si), Ge, SiGe, GaAs, InAs, InP and all other III/V compounds. The adhesion layer structure may be selected from the group Pt, Ir, Zr, Ti, TiOx, IrOx, PtOx, ZrOx, TiN, TiAlN, TaN, TaSiN, etc., consisting of noble metals, alloys of noble metals, alloys of noble and non-noble metals, conductive noble metal oxides, insulating metal oxides, insulating metal nitrides, conducting metal nitrides, and combinations, multilayers or mixtures thereof.

The lower electrode structure may be selected from the group Pt, Pd, Ir, Ru, Rh, Re, Os, Au, Ag, Cu, etc., consisting of transition metals, noble metals, alloys of noble metals, alloys of noble and non-noble metals, or from the group PtOx, IrOx, RuOx consisting of conductive oxides, and combinations, multilayers, or mixtures thereof.

The upper electrode structure may be selected from the group Pt, Pd, Ir, Ru, Rh, Re, Os, Au, Ag, Cu, etc., consisting of transition metals, noble metals, alloys of noble metals, alloys of noble and non-noble metals, or from the group PtOx, IrOx, RuOx SrRuO3, LaNiO3, etc., consisting of conductive oxides and combinations, multilayers, or mixtures thereof.

Although in the embodiment the thin film capacitor is applied to a semiconductor memory, such as DRAM, it is also applicable to decoupling capacitors and tunable filter circuits and other suitable devices.

This patent application is based upon and claims the benefit of the earlier filing date of Japanese Patent Application No. 2006-100595 filed Mar. 31, 2006, the entire contents of which are incorporated herein by reference.

What is claimed is:

1. A method for fabricating a thin film capacitor comprising steps of:
   forming a dielectric film over a bottom electrode, the dielectric film being composed of at least Ba, Sr, Ti, and O at prescribed compositions;
   controlling a deposition condition of a top electrode when forming the top electrode over the dielectric film so as to produce a reduced Ba-I region in the dielectric film, in which region an average concentration of perovskite type Ba cations (Ba-I) is less than an average concentration of non-perovskite type Ba cations (Ba-II), at or near a boundary between the top electrode and the dielectric film; and
   annealing the thin film capacitor in a temperature range of 100° C. to 900° C. in an oxygen atmosphere after the top electrode is formed.

2. The method of claim 1, wherein the deposition condition is controlled such that a ratio R=(atm % Ba-I)/[(atm % Ba-I)+(atm % Ba-II)] is within a range of 0.1<R<0.2.

3. The method of claim 1, wherein the reduced Ba-I region is produced so as to extend to 5.0 nm, and more preferably, to 2.5 nm, from the boundary.

4. The method of claim 2, further comprising a step of:
   annealing the thin film capacitor in a temperature range of 100° C. to 900° C. in an oxygen atmosphere after the top electrode is formed.

5. A method for fabricating a semiconductor device comprising the steps of:

forming a transistor on a semiconductor substrate;

forming a thin film capacitor electrically connected to the transistor, the thin film capacitor including a dielectric film held between a top electrode and a bottom electrode, wherein during the formation of the thin film capacitor, a reduced Ba-I region is formed in the dielectric film in which an average concentration of perovskite type Ba cations (Ba-I) is less than an average concentration of non-perovskite type Ba cations (Ba-II), at or near a boundary between the top electrode and the dielectric film; and annealing the thin film capacitor in a temperature range of 100° C. to 900° C. in an oxygen atmosphere.

6. The method of claim 5, the thin film capacitor forming step including a step of:

controlling a deposition condition of the top electrode such that in the reduced Ba-I region a ratio R=(atm % Ba-I)/[(atm % Ba-I)+(atm % Ba-II)] is within a range of $0.1<R<0.2$.

7. The method of claim 5, further comprising steps of:

forming a contact plug for electrically connecting the transistor to the thin film capacitor; and forming an adhesion layer to be located between the contact plug and the thin film capacitor.

* * * * *